United States Patent
Han et al.

(10) Patent No.: US 12,432,901 B2
(45) Date of Patent: Sep. 30, 2025

(54) TECHNOLOGIES FOR FABRICATING A VERTICAL DRAM STRUCTURE

(71) Applicant: Tokyo Electron Limited, Tokyo (JP)

(72) Inventors: Sang Cheol Han, Albany, NY (US); Soo Doo Chae, Albany, NY (US); Sunghil Lee, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 752 days.

(21) Appl. No.: 17/668,838

(22) Filed: Feb. 10, 2022

(65) Prior Publication Data
US 2023/0255014 A1   Aug. 10, 2023

(51) Int. Cl.
*H10B 12/00* (2023.01)
*G11C 11/402* (2006.01)

(52) U.S. Cl.
CPC ...... *H10B 12/0383* (2023.02); *G11C 11/4023* (2013.01); *H10B 12/37* (2023.02)

(58) Field of Classification Search
CPC .... H10B 12/312; H10B 12/315; H10B 12/33; H10B 12/02; H10B 12/36; H10B 12/056; H10B 12/00-50; H10B 12/10; H10B 12/05-056; H10B 12/30-395; H10B 12/03-0387; H01L 28/40-92; H01L 2924/1436-14369; G11C 11/401-4099; G11C 14/0009-0045; G11C 2211/4016; G11C 14/0018
See application file for complete search history.

(56) References Cited

U.S. PATENT DOCUMENTS

| | | | | |
|---|---|---|---|---|
| 4,713,678 A | * | 12/1987 | Womack | H10B 12/395 257/70 |
| 5,256,588 A | * | 10/1993 | Witek | H10B 12/0383 438/242 |
| 9,165,722 B2 | * | 10/2015 | Hanbuecken | H01G 4/38 |
| 11,211,384 B2 | * | 12/2021 | Sills | H10B 12/033 |
| 11,968,821 B2 | * | 4/2024 | Sills | H10B 12/033 |
| 12,016,176 B2 | * | 6/2024 | Jang | H10B 12/0335 |
| 2015/0294977 A1 | * | 10/2015 | Kim | H10B 43/40 257/314 |
| 2023/0133157 A1 | * | 5/2023 | Xie | H01L 23/50 257/532 |
| 2023/0253476 A1 | * | 8/2023 | Sen Gupta | H01L 29/785 257/288 |

* cited by examiner

*Primary Examiner* — Jeff W Natalini
*Assistant Examiner* — Andrew Zabel

(57) ABSTRACT

Technologies for fabricating a vertical dynamic random access memory (DRAM) structure include forming a DRAM cell hole through a word line layer and an associated substrate such that a first section of the DRAM cell hole extends through the word line layer and a second section of the DRAM cell hole extends through the substrate in vertical alignment with the first section. A pillar capacitor structure is initially formed using the second section of the DRAM cell hole, followed by the formation of a transistor using the first section of the DRAM cell hole as a channel for the transistor. Due to the use of a common DRAM cell hole, the pillar capacitor structure and the channel are in vertical alignment. The substrate is subsequently flipped and removed from the pillar capacitor structure, which is further processed to form a pillar capacitor. In some embodiments, the channel may be formed from a deposition of indium gallium zinc oxide (IGZO).

13 Claims, 8 Drawing Sheets

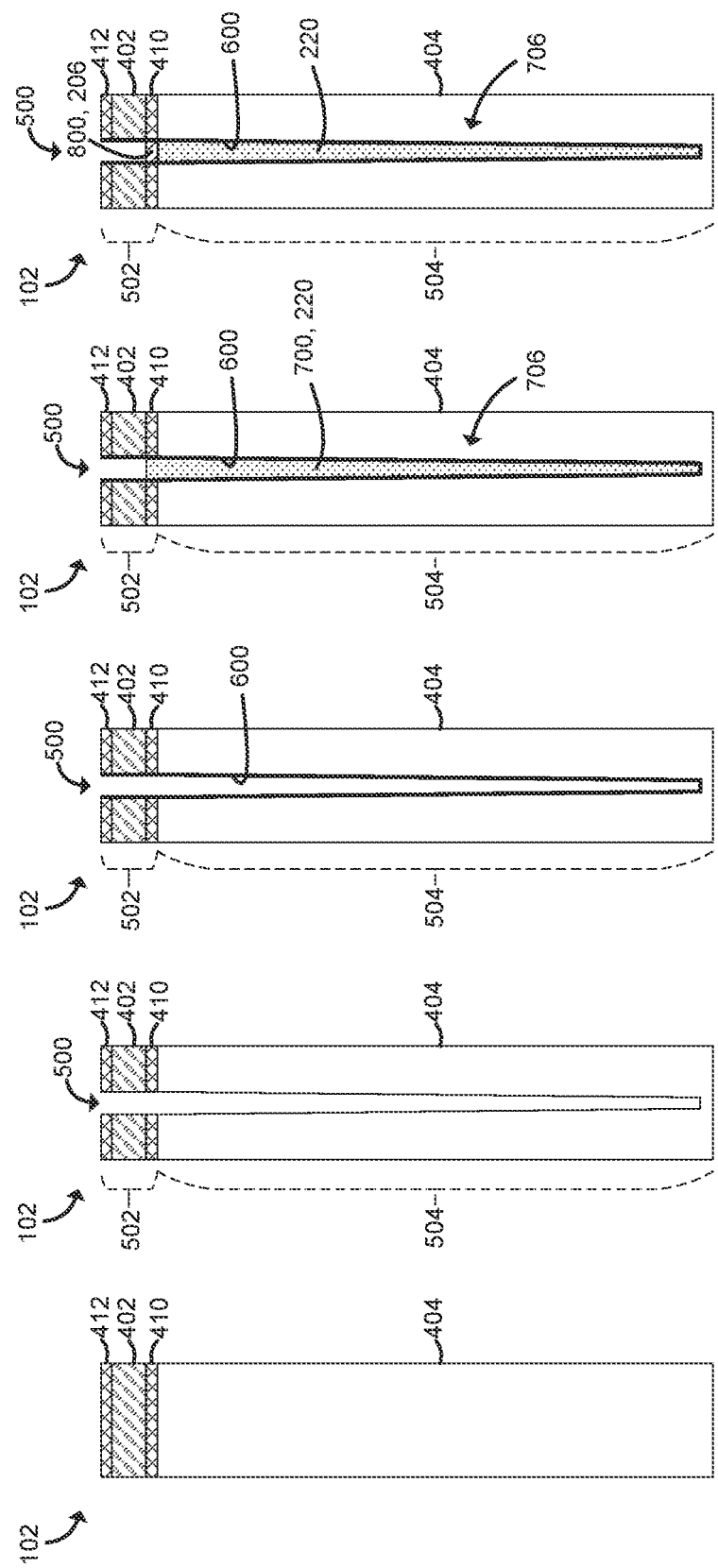

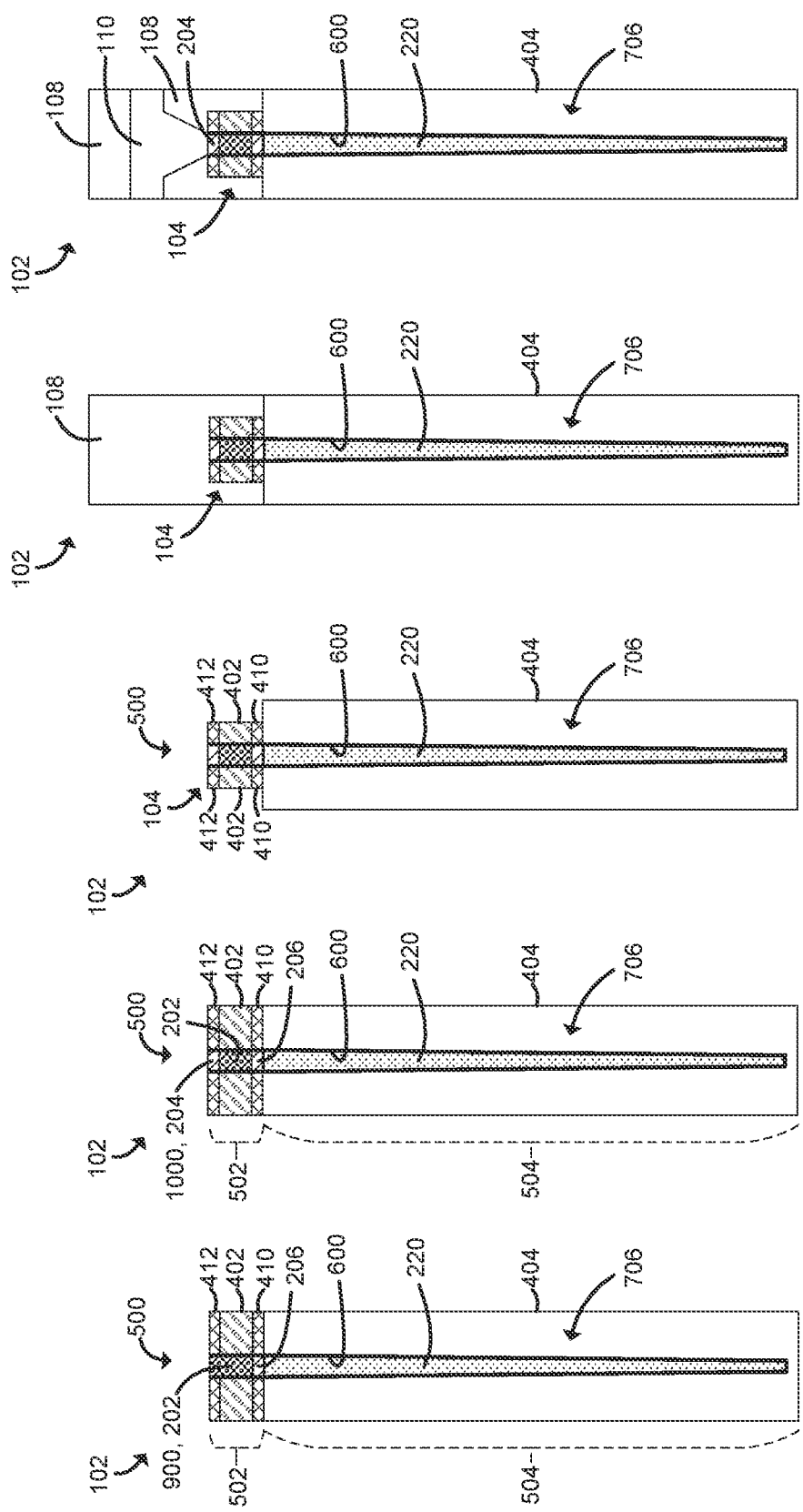

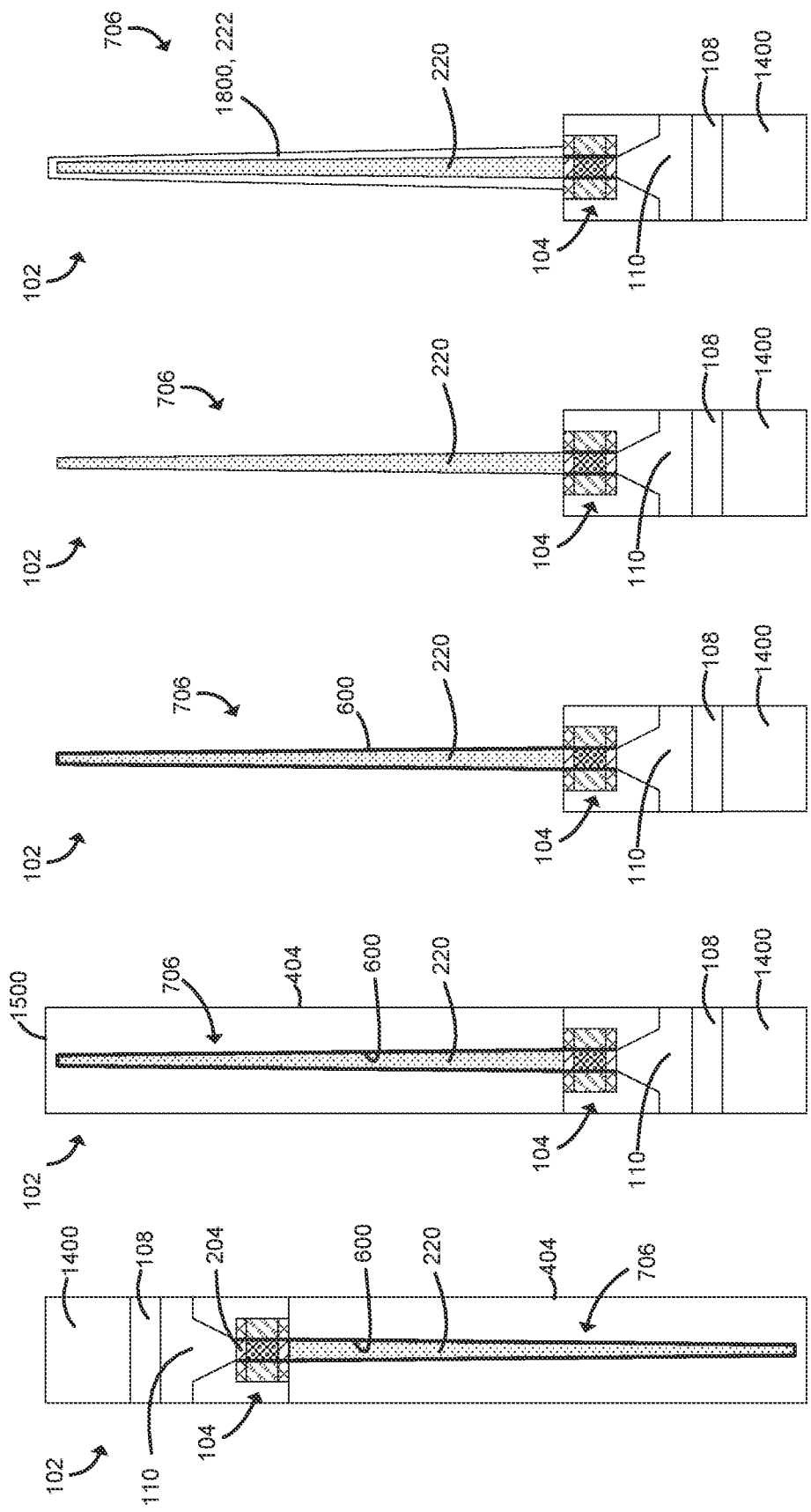

TECHNOLOGIES FOR FABRICATING A VERTICAL DRAM STRUCTURE

FIELD OF THE DISCLOSURE

The present disclosure relates to dynamic random access memory (DRAM) structures and methodologies for fabricating DRAM structures and, more particular, to vertical DRAM structures having pillar capacitors and associated fabrication techniques.

BACKGROUND

Memory circuits are widely used in various electronic devices to facilitate the storage of data. Generally, memory circuits may be volatile or non-volatile with regard to the stored data. One type of volatile memory is DRAM, which typically includes a transistor and associated capacitor for each memory cell of the DRAM module. The transistor is configured to control the charging and discharging of the associated capacitor, the state of which defines the logical 0 or 1. However, the associated capacitor will gradually "leak" its charge over time thereby losing its associated logical data, which is why the DRAM is considered a type of non-volatile memory. Typically, the capacitor leakage is compensated via use of a memory refresh circuit configured to recharge the capacitor so as to rewrite the logical data stored therein.

Historically, DRAM modules have been formed as a single plane structure, with each bit transistor and its associated capacitor arranged on a common, two-dimensional memory plane. However, increasing the density of typical planar memory architecture has proven challenging in attempts to move from a $6F^2$ cell architecture to a more dense $4F^2$ cell architecture. One type of $4F^2$ cell architecture of DRAM modules is a vertical DRAM architecture in which the associated capacitor is positioned vertical to the transistor (either above or below). By arranging the transistor and associated capacitor in a three-dimensional architecture as the vertical DRAM, the density of memory cells of the DRAM can be increased.

SUMMARY

According to an aspect of the disclosure, a method for forming a vertical dynamic random access memory (DRAM) structure includes forming a word line layer on a first side of a substrate and forming a DRAM cell hole through the word line layer and the substrate. The DRAM cell hole includes a first section that extends through the word line layer and a second section that extends through the substrate. The method also includes filling at least a portion of the second section of the DRAM cell hole with a conductive material, forming a pillar capacitor structure using the conductive material in the second section of the DRAM cell hole as a conductive core of the pillar capacitor structure, and forming a transistor by providing a source contact, a drain contact, and a transistor channel in the first section of the DRAM cell hold.

In some embodiments, forming the transistor channel may include depositing a semiconductor material into the first section of the DRAM cell hole. Additionally, in some embodiments, the method may further include flipping the substrate, subsequent to forming the transistor, to expose a second side of the substrate opposite the first side and removing the substrate to reveal the pillar capacitor structure.

Additionally, in some embodiments, forming the pillar capacitor structure may include providing polysilicon in the second section of the DRAM cell hole to form a polysilicon conductive core. In such embodiments, the method may further include flipping the substrate, subsequent to forming the transistor, to expose a second side of the substrate opposite the first side and removing the substrate to reveal the polysilicon conductive core. Additionally, in such embodiments, the method may include forming, subsequent to the removing of the substrate, a capacitor dielectric layer on the polysilicon conductive core and forming a capacitor electrode on the dielectric layer. Furthermore, in some embodiments, forming the dielectric layer may include forming a Zirconia-Alumina-Zirconia (ZrO2/Al2O3/ZrO2) layer on the polysilicon conductive core. In such embodiments, forming the electrode may include forming a Titanium Silicon Nitride (TiSiN) electrode on the ZrO2/Al2O3/ZrO2 layer.

In some embodiments, forming the word line layer may include depositing a first insulator layer on the first side of the substrate, depositing a metallization layer on the first insulator layer, and forming a second insulating later on the metallization layer. Additionally, in some embodiments, the method may further include forming an insulator liner in the DRAM cell hole. In such embodiment, filling at least a portion of the second section of the DRAM cell hole with the conductive material may include forming the conductive material on the insulator liner and in the second section of the DRAM cell hole. Additionally, in such embodiments, forming the transistor using the first section of the DRAM cell hole as the channel of the transistor may include forming a transistor using a portion of the insulator liner located in the first section of the DRAM cell hole as a gate oxide of the transistor.

Furthermore, in some embodiments, forming the transistor may include forming a drain contact in the first section of the DRAM cell hole and on a proximal surface of the polysilicon conductive core, depositing indium gallium zinc oxide (IGZO) on the drain contact and in the first section of the DRAM cell hole to form the transistor channel of the transistor, and forming a source contact on the transistor channel of the transistor and in the first section of the DRAM cell hole. Additionally, in some embodiments, forming the transistor may include trimming the word line layer to define a width of the transistor, depositing an insulator layer over the transistor, and forming a bit line in the insulator layer and in contact with the source contact. In such embodiments, the method may also include flipping the substrate, subsequent to forming the transistor, to expose a second side of the substrate opposite the first side, and removing the substrate to reveal the polysilicon conductive core. The method may also include forming, subsequent to the removing of the substrate, a dielectric layer on the polysilicon conductive core and forming an electrode on the dielectric layer.

According to another aspect of the disclosure, a vertical dynamic random access memory (DRAM) structure may include a transistor including a channel having a top side, a bottom side opposite the top side, and a sidewall extending from the top side to the bottom side, a source contact formed on the bottom side of the channel, a drain contact formed on the top side of the channel, and a gate contact formed on the sidewall of the channel, wherein the channel comprises indium gallium zinc oxide (IGZO). The vertical DRAM may also include a pillar capacitor coupled to the source contact and extending away therefrom.

In some embodiments, the pillar capacitor has a proximal side coupled to the source contact. In such embodiments, the proximal surface of the pillar capacitor is aligned with the channel of the transistor. Additionally, in such embodiments, the proximal surface of the pillar capacitor has a perimeter that is vertically aligned with a perimeter of the channel of the transistor. In some embodiments, the pillar capacitor may include a conductive core comprising polysilicon, a dielectric formed on the conductive core and comprising Zirconia-Alumina-Zirconia (ZrO2/Al2O3/ZrO2), and an electrode formed on the dielectric and comprising Titanium Silicon Nitride (TiSiN). Additionally, in some embodiments, the transistor and the pillar capacitor may cooperate to define a memory cell of a plurality of memory cells of the vertical dram structure. In such embodiments, each memory cell of the plurality of memory cells includes a transistor having a channel formed from IGZO and a pillar capacitor extending away from the channel of the corresponding transistor.

According to a further aspect of the disclosure, a method for forming a vertical dynamic random access memory (DRAM) structure may include forming a word line layer on a first side of a substrate and forming a DRAM cell hole through the word line layer and the substrate. The DRAM cell hole may include a first section that extends through the word line layer and a second section that extends through the substrate. The method may also include providing polysilicon in the second section of the DRAM cell hole to form a polysilicon conductive core of a pillar capacitor structure and providing indium gallium zinc oxide (IGZO) in the first section of the DRAM cell hole to form a channel of a transistor. In some embodiments, the method may further include flipping the substrate, subsequent to providing the IGZO in the first section of the DRAM cell hole, to expose a second side of the substrate opposite the first side and removing the substrate to reveal the polysilicon conductive core of the pillar capacitor structure. In such embodiments, the method may also include forming, subsequent to the removing of the substrate, a dielectric layer on the polysilicon conductive core and forming an electrode on the dielectric layer.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

Figure 3A:
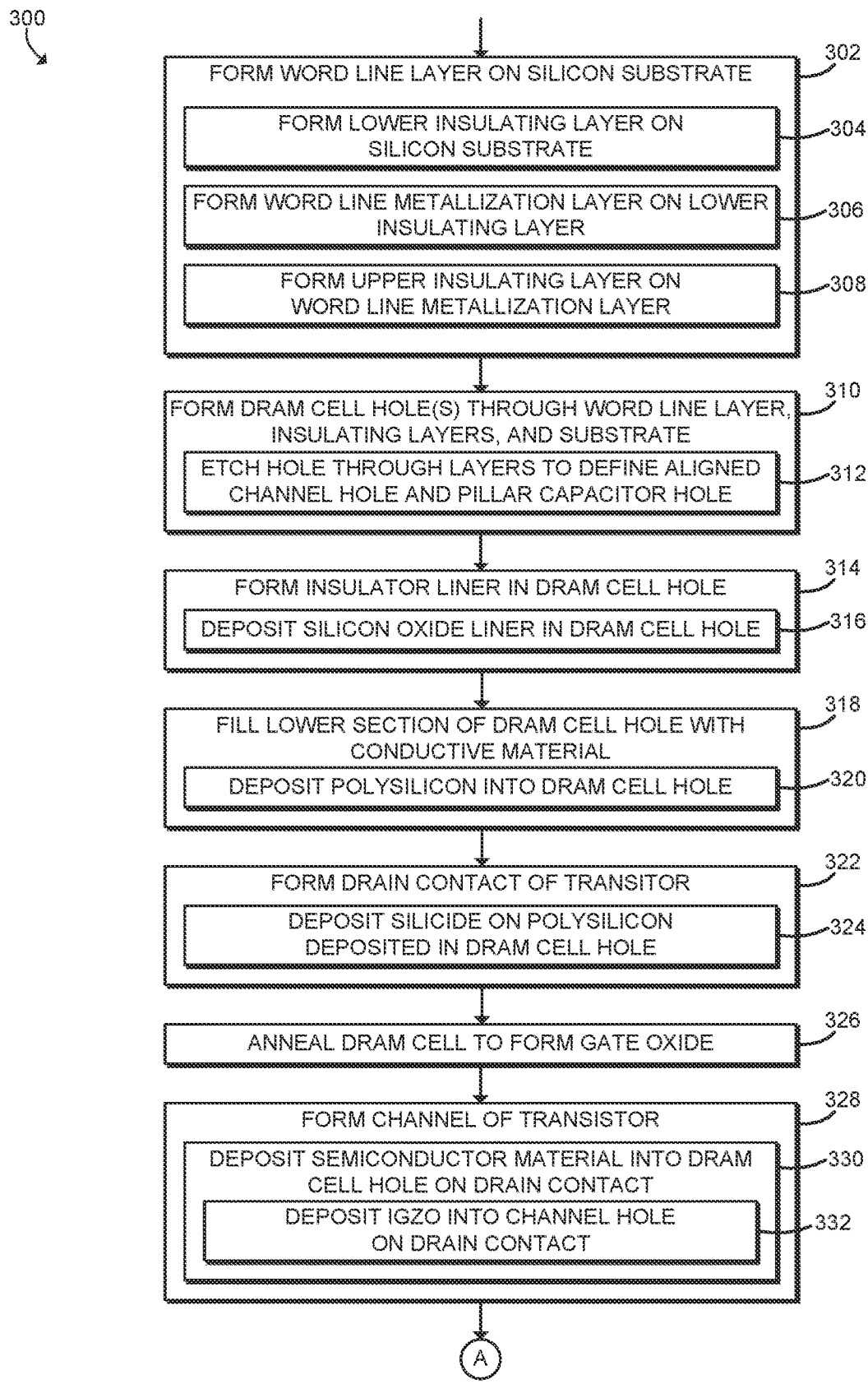
FIGS. 3A-3B are a simplified flow chart of at least one embodiment of a method for fabricating the vertical DRAM structure of FIG. 1.
Figure 3B:
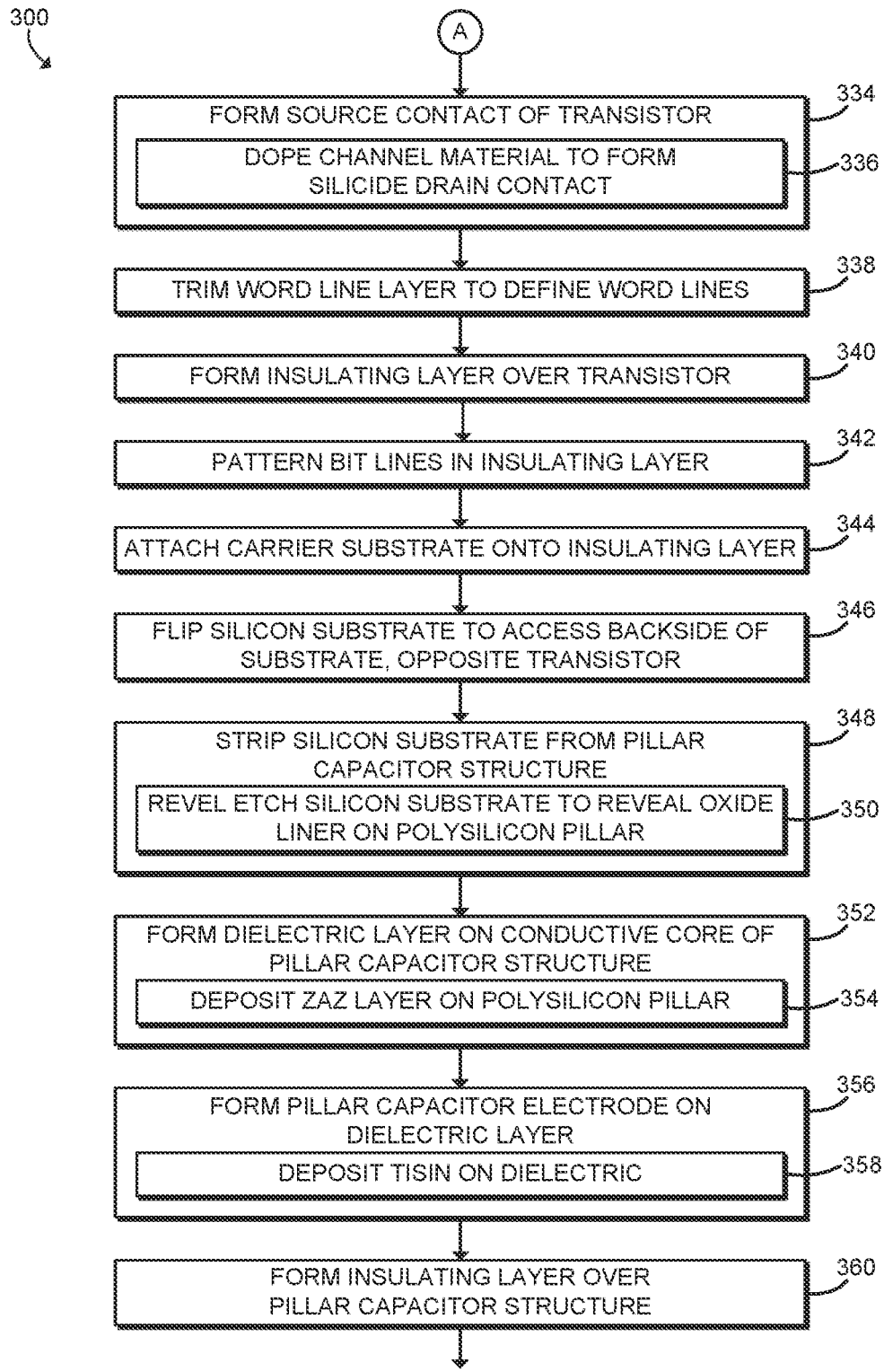

FIG. 4 is a cross-sectional, elevation view of a least one embodiment of a vertical DRAM structure formed during the performance of the method of FIGS. 3A-3B and having a word line layer formed on a substrate;

FIG. 5 is a cross-sectional, elevation view of a least one embodiment of the vertical DRAM structure of FIG. 4 subsequent to the formation of a DRAM cell hole having a first section extending through the word line layer and a vertically aligned second section that extends through the substrate during the performance of the method of FIGS. 3A-3B;

FIG. 6 is a cross-sectional, elevation view of a least one embodiment of the vertical DRAM structure of FIG. 5 subsequent to the formation of an insulator liner in the DRAM cell hole during the performance of the method of FIGS. 3A-3B;

FIG. 7 is a cross-sectional, elevation view of a least one embodiment of the vertical DRAM structure of FIG. 6 subsequent to the filling of the second section of the DRAM cell hole with a conductive material to form a pillar capacitor structure during the performance of the method of FIGS. 3A-3B;

FIG. 8 is a cross-sectional, elevation view of a least one embodiment of the vertical DRAM structure of FIG. 7 subsequent to the formation of a drain contact of a transistor in the first section of the DRAM cell hole during the performance of the method of FIGS. 3A-3B;

FIG. 9 is a cross-sectional, elevation view of a least one embodiment of the vertical DRAM structure of FIG. 8 subsequent to the filling of the first section of the DRAM cell hole with a semiconductor material to form a channel of the transistor during the performance of the method of FIGS. 3A-3B;

FIG. 10 is a cross-sectional, elevation view of a least one embodiment of the vertical DRAM structure of FIG. 9 subsequent to the formation of a source contact of the transistor in the first section of the DRAM cell hole during the performance of the method of FIGS. 3A-3B;

FIG. 11 is a cross-sectional, elevation view of a least one embodiment of the vertical DRAM structure of FIG. 10 subsequent to a trimming of the word line layer during the performance of the method of FIGS. 3A-3B;

FIG. 12 is a cross-sectional, elevation view of a least one embodiment of the vertical DRAM structure of FIG. 11 subsequent to the formation of an insulator layer over the transistor during the performance of the method of FIGS. 3A-3B;

FIG. 13 is a cross-sectional, elevation view of a least one embodiment of the vertical DRAM structure of FIG. 12 subsequent to the formation of a bit line in the insulator layer during the performance of the method of FIGS. 3A-3B;

FIG. 14 is a cross-sectional, elevation view of a least one embodiment of the vertical DRAM structure of FIG. 13 subsequent to attachment of a carrier substrate to the insulator layer during the performance of the method of FIGS. 3A-3B;

FIG. 15 is a cross-sectional, elevation view of a least one embodiment of the vertical DRAM structure of FIG. 14 subsequent to a flipping procedure to flip the orientation of the vertical DRAM structure, relative to the vertical DRAM structure of FIG. 14, during the performance of the method of FIGS. 3A-3B;

FIG. 16 is a cross-sectional, elevation view of a least one embodiment of the vertical DRAM structure of FIG. 15 subsequent to the stripping of the substrate from the pillar capacitor structure during the performance of the method of FIGS. 3A-3B;

FIG. 17 is a cross-sectional, elevation view of a least one embodiment of the vertical DRAM structure of FIG. 16 subsequent to the removal of the insulator liner from the pillar capacitor structure during the performance of the method of FIGS. 3A-3B;

FIG. 18 is a cross-sectional, elevation view of a least one embodiment of the vertical DRAM structure of FIG. 17 subsequent to the formation of a dielectric layer on the revealed pillar capacitor structure during the performance of the method of FIGS. 3A-3B;

Figure 20:
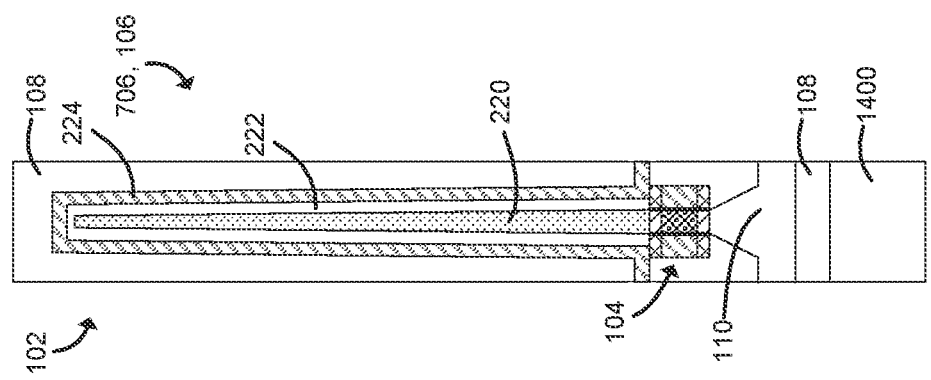
Figure 19:
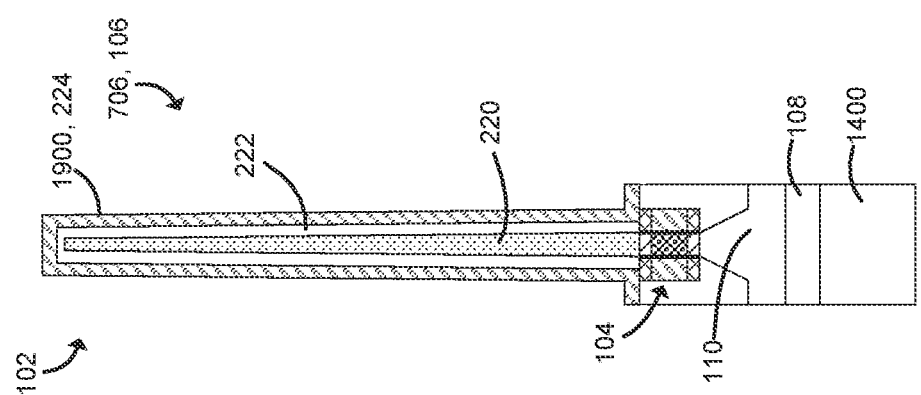
Figure 22:
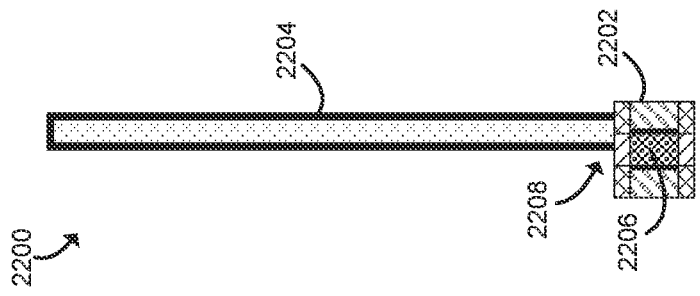
Figure 21:
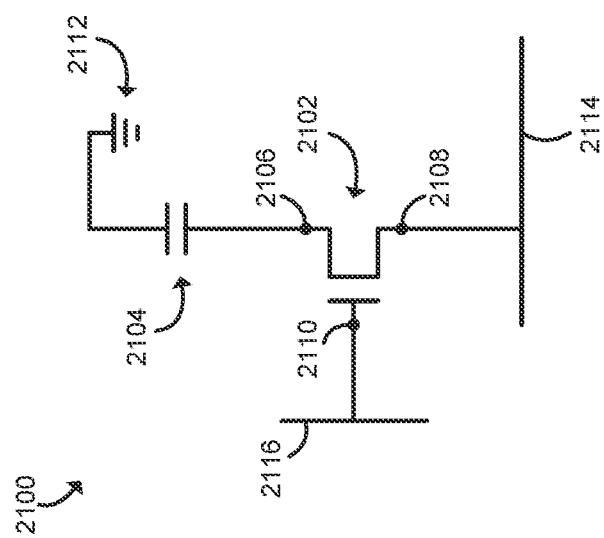

FIG. 19 is a cross-sectional, elevation view of a least one embodiment of the vertical DRAM structure of FIG. 18 subsequent to the formation of an electrode on the pillar capacitor structure during the performance of the method of FIGS. 3A-3B;

FIG. 20 is a cross-sectional, elevation view of a least one embodiment of the vertical DRAM structure of FIG. 19 subsequent to the formation of an insulator layer over the pillar capacitor structure during the performance of the method of FIGS. 3A-3B;

FIG. 21 is an illustrative electrical circuit representation of an illustrative vertical DRAM cell; and FIG. 22 is a cross-sectional, elevation view of a typical vertical DRAM structure.

DETAILED DESCRIPTION OF THE DRAWINGS

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); or (A, B, and C). Similarly, items listed in the form of "at least one of A, B, or C" can mean (A); (B); (C): (A and B); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring initially to FIG. 21 and as discussed above, a typical memory cell circuit 2100 of a vertical dynamic random access memory (DRAM) includes a transistor 2102 and an associated pillar capacitor 2104. The transistor 2102 includes a drain contact 2106, a source contact 2108, and a gate contact 2110. The drain contact 2106 of the transistor 2102 is connected to the pillar capacitor 2104, which is also connected to a ground contact 2112 as shown. The source contact 2108 of the transistor 2102 is connected to a bit line 2114, and the gate contact 2110 is connected to a word line 2116. In use, the memory cell circuit 2100 is configured to store a logical bit in the pillar capacitor 2104. To do so, the transistor 2102 is controlled via the word line 2116 to charge and discharge the pillar capacitor 2104 from/to the bit line 2114. As such, the charge/discharge state of the pillar capacitor 2104 defines the state of the logical bit.

An architecture of a typical DRAM cell 2200 is shown in FIG. 22. The typical DRAM cell 2200 includes a transistor 2202 and an associated pillar capacitor 2204. While vertical DRAMs provide one technique for increasing the density of an associated DRAM module as discussed above, alignment between the pillar capacitor 2204 and the transistor 2202 can be challenging due to limitations of the processing technique, including the obtainable pitch of the photoresist masks typically used in such processing. A common occurrence in typical DRAM cells 2200 is a misalignment between the pillar capacitor 2204 and a channel 2206 of the transistor 2202 as indicated by arrow 2208. Such misalignment can deteriorate the performance of the typical DRAM cell 2200 or otherwise render the DRAM cell 2200 inoperable, thereby reducing the total yield of the DRAM cells of the associated DRAM module. That is, because the transistor 2202 is typically formed first, it can be difficult to properly align the pillar capacitor 2204 over the channel 2206 during the subsequent formation of the pillar capacitor 2204 due the pitch limitations of processing techniques, which can result in the misalignment indicated by arrow 2208.

Figure 2:
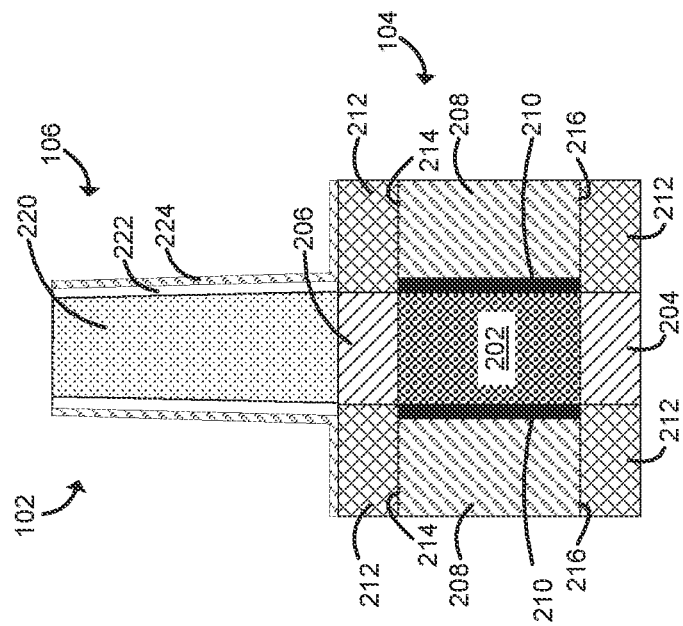
FIG. 2 is an enlarged cross-sectional, elevation view of a pass gate transistor and a portion of the associated pillar capacitor of the vertical DRAM structure of FIG. 1.
Figure 1:
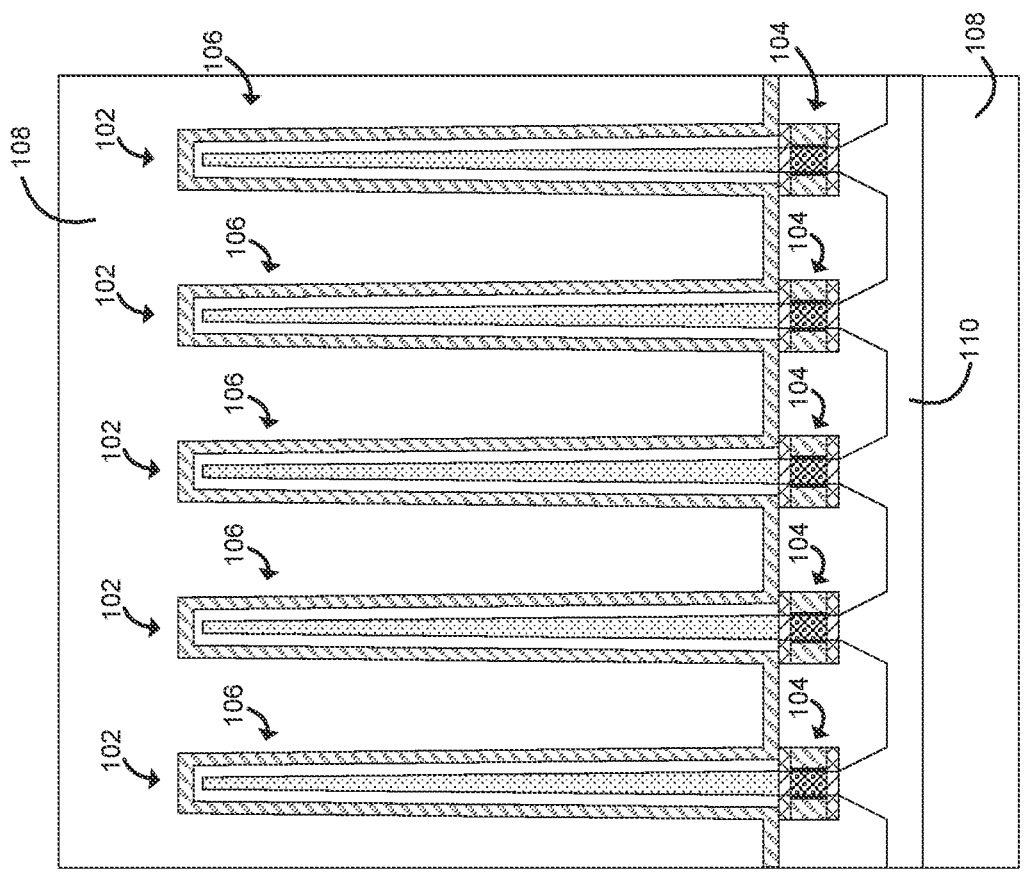
FIG. 1 is a cross-sectional, elevation view of at least one embodiment of a vertical DRAM structure having multiple DRAM cells, each of which includes a pass gate transistor and an associated pillar capacitor in vertical alignment with the corresponding pass gate transistor.

Referring now to FIGS. 1 and 2, a vertical DRAM module 100 fabricated according to the techniques disclosed herein is shown. The vertical DRAM module 100 includes a number of individual vertical DRAM structures 102, each of which defines a single logical bit of the vertical DRAM module 100. Each vertical DRAM structure 102 includes a pass gate transistor 104 and an associated pillar capacitor 106, which extends "upwardly" away from transistor 104. An insulator layer 108 is formed over the pillar capacitor 106 and the transistor 104. The insulator layer 108 is illustratively formed from silicon oxide, but may be formed from other insulator materials in other embodiments. Additionally, a bit line 110 is formed in the insulator layer 108 and is in contact with each of the pass gate transistors 104 of the vertical DRAM module 100. The bit line 110 may be formed from any suitable conductive material, such as Copper (Cu), Tungsten (W), or Ruthenium (Ru).

As best shown in FIG. 2, each transistor 104 includes a channel 202 positioned vertically between a source contact 204 and a drain contact 206 of the corresponding transistor 104. The source contact 204 is coupled to the bit line 110 as shown in FIG. 1, and the drain contact 206 is coupled to the associated pillar capacitor 106 as discussed in more detail below. Illustratively, each of the source contact 204 and the drain contact 206 is formed from a conductive silicide material, such as Tungsten silicide or Titanium silicide.

Alternatively, the contacts 204, 206 may be formed from silicon or other material having been properly doped to lower resistivity (e.g., via a Phosphorus, Arsenic, or other doping procedure). The channel 202, however, is formed from a semiconductor material, which is formed via a deposition process in some embodiments. For example, in the illustrative embodiment and as discussed in more detail below, the channel 202 is formed from a deposition of indium gallium zinc oxide (IGZO), which may be doped or undoped. Of course, in other embodiments, other types of semiconductor materials may be used.

Each transistor 104 also includes a gate contact 208 that encircles or otherwise bounds the channel 202. Illustratively, the gate contact 208 forms a portion of the word line for the vertical DRAM module 100 and may be formed from any suitable conductive material, such as copper or tungsten. A gate oxide 210 (e.g., silicon oxide) is disposed between the gate contact 208 and the channel 202. Additionally, an insulator layer 212 is formed on a top surface 214 and a bottom surface 216 of the gate contact 208. The insulator layer 212 may be formed from any suitable insulator material, such as silicon nitride.

The pillar capacitor 106 includes a conductive core 220, a dielectric layer 222 formed on the conductive core 220, and an electrode 224 formed over the dielectric layer 222. The conductive core 220 may be formed from any suitable conductive material, such as polysilicon. Conversely, the dielectric layer 222 is formed from an insulator material. For example, in the illustrative embodiment, the dielectric layer 222 if formed from Zirconia-Alumina-Zirconia ($ZrO_2$/$Al_2O_3$/$ZrO_2$ or ZAZ), but may be formed from another type of insulator material in other embodiments. The electrode 224 is formed from a conductive metal, such as Titanium Silicon Nitride (TiSiN). In some embodiments, as shown in FIG. 1, the electrode 224 of multiple vertical DRAM structure 102 may be connected to each other to form a semi-continuous layer of metal across a set of vertical DRAM structures 102.

As shown in FIG. 2, the conductive core 220 of the pillar capacitor 106 and the channel 202 of the transistor 104 are vertically aligned with each other due to being formed in different sections of a common DRAM cell hole as discussed in detail below. In this way, the common DRAM cell hole ensures vertical alignment between the conductive core 220 and the channel 202. Additionally, as discussed in more detail below, the pillar capacitor 106 is initially formed (or portions thereof) followed by the formation of the transistor 104, which reduces the misalignment caused from the limitations of masking procedures experienced in typical vertical DRAM fabrication techniques in which the transistor is formed prior to formation of the associated pillar capacitor. Because the pillar capacitor 106 is vertically aligned with the channel 202 (and the drain contact 206), the efficiency of the vertical DRAM structure 102 may be increased relative to mis-aligned vertical DRAM structures.

It should be appreciated that features of the vertical DRAM module 100 and the vertical DRAM structure 102 have been enlarged in FIGS. 1 and 2, as well as the following figures described below, for visual clarity of those figures. For example, the thickness of the dielectric layer 222 and the electrode 224 have been enlarged, relative to other features of the vertical DRAM structure 102, to clearly illustrate those features. As such, it should be appreciated that the figures described herein are not necessarily to scale and the relative size of certain features illustrated in those figures may have been enlarged, shrunk, or otherwise modified for clarity of the figures and the description below.

Additionally, it should be appreciated that the illustrated architecture of the vertical DRAM structure 102 and associated vertical DRAM module 100 of FIGS. 1 and 2 is a simplified, abstracted illustration of the associated memory cells and may include additional or different architectures, layers, devices, portions, and/or structures, which are not shown in the associated figures for clarity of the drawings, in other embodiments depending on the type and complexity of the vertical DRAM structures 102. Furthermore, it should be appreciated that, while various layers of the vertical DRAM structure 102 have been described as being formed "on" another layer of the vertical DRAM structure 102, such layers may be formed directly on top of the other layer or may have one or more other intervening layers between the two described layers (e.g., insulator layers).

Referring now to FIGS. 3A and 3B, in some embodiments, a method 300 may be performed to fabricate each vertical DRAM structure 102 of the vertical DRAM module 100. It should be appreciated that not every fabrication step may be described below, and that one of ordinary skill in the art would understand that additional, related and non-related steps (e.g., various cleaning steps) may be performed throughout the method 300. The method 300 begins with block 302 in which a word line layer 402 is formed on a silicon substrate 404 as shown in FIG. 4. To do so, in block 304, a lower insulator layer 410 is initially formed on the silicon substrate 404. Subsequently, in block 306, the word line layer 402 is formed on the lower insulator layer 410, followed by the formation of an upper insulator layer 412 on the word line layer 402 in block 308. Illustratively, each of the insulator layers 410, 412 is formed from silicon nitride, but may be formed from another insulator material in other embodiments. The word line layer 402, from which the gate contact 208 will be formed, is illustratively formed from tungsten (e.g., a tungsten silicide), but may be formed from another conductive material in other embodiments. Each of the word line layer 402 and the insulator layers 410, 412 may be formed using any suitable deposition, growth, or formation technique such as a chemical vapor deposition (CVD) or plasma-enhanced chemical vapor deposition technique.

Referring back to FIG. 3A, after the word line layer 402 has been formed on the silicon substrate 404, the method 300 advances to block 310. In block 310, a DRAM cell hole 500 is formed through the word line layer 402, the insulator layers 410, 412, and the silicon substrate 404 for each memory cell of the vertical DRAM module 100 as shown in FIG. 5. To do so, in the illustrative embodiment in block 312, the DRAM cell hole 500 is etched into the layers 402, 410, 412 and the silicon substrate 404 using a suitable masking and etching process. As discussed in more detail below, the DRAM cell hole 500 is formed as a continuous hole through the layers 402, 410, 412 and into the silicon substrate 404 and separate sections of DRAM cell hole 500 are used to form the conductive core 220 of the pillar capacitor 106 and the channel 202 of the associated transistor 104 of the vertical DRAM structure 102. As such, because conductive core 220 and the channel 202 are both formed in a common DRAM cell hole 500, the conductive core 220 and the associated channel 202 are ensured to be aligned with each other. That is, as shown in FIG. 5, the DRAM cell hole 500 includes an upper section 502 that extends through word line layer 402 and a lower section 504 that extends through the silicon substrate 404. As discussed in more detail below, the upper section 502 is later used to form the channel 202, while the lower section 504 is used to form the conductive core 220. As such, the channel 202 and the conductive core 220 are vertically aligned with each other due to the vertical alignment of the sections 502, 504 of the common DRAM cell hole 500.

Referring again back to FIG. 3A, after the DRAM cell hole(s) 500 have been formed, the method 300 advances to block 314 in which an insulator liner 600 is formed in the DRAM cell hole 500. The insulator liner 600 may be formed from any suitable insulator material. For example, in the illustrative embodiment in block 316, a silicon oxide liner is formed in each DRAM cell hole 500 of the vertical DRAM module 100. To do so, a silicon layer may be initially deposited in the DRAM cell hole 500, followed by a suitable annealing process to form the silicon oxide layer. Regardless, after the insulator liner 600 has been formed in the DRAM cell hole 500, the lower section 504 of the DRAM cell hole 500 is filled with a conductive material 700 in block 318 to form a pillar capacitor structure 706 as shown in FIG. 7. For example, in block 320 of FIG. 3A, the lower section 504 of the DRAM cell hole 500 is filed with polysilicon 700, which subsequently forms the conductive core 220 of the pillar capacitor 106.

After the lower section 504 of the DRAM cell hole 500 has been filled with the conductive material 700 in block 318, the method 300 advances to block 322. In block 322, the drain contact 206 is formed. To do so, in the illustrative embodiment, a silicide 800 (e.g., a Tungsten or Titanium silicide) is deposited in the upper section 502 of the DRAM cell hole 500 on the polysilicon previously formed in the lower section 504 as shown in FIG. 8. Alternatively, the drain contact 206 may be formed from silicon or other material having been properly doped to lower resistivity (e.g., via a Phosphorus, Arsenic, or other doping procedure).

Referring back to FIG. 3A, after the drain contact 206 has been formed in block 318, the method 300 advances to block 326 in which the present vertical DRAM structure 102 is annealed to form the gate oxide 210 from the insulator liner 600 formed in the upper section 502 of the DRAM cell hole 500. To do so, in the illustrative embodiment, the vertical DRAM structure 102 is annealed at a temperature of 800 degrees Celsius for two hours, although other annealing procedures may be used in other embodiments. Regardless, after the gate oxide 210 has been formed in block 326, the channel 202 is formed in block 328. To do so, in block 330, a semiconductor material 900 is deposited in the upper section 502 of the DRAM cell hole 500 on the drain contact 206 as shown in FIG. 9. In the illustrative embodiment as shown in block 332, indium gallium zinc oxide (IGZO) is deposited in the upper section 502 of the DRAM cell hole 500 to form the channel 202. However, in other embodiments, other types of semiconductor materials may be used to form the channel 202. Additionally, in some embodiments the channel semiconductor material (e.g., IGZO) may be doped in block 328 to modify the conductivity characteristics of the channel 202.

It should be appreciated that the techniques provided herein to form the channel 202 may utilize semiconductive oxide materials (sometimes referred to herein as "conductive oxides"), which may have similar properties to semiconductor materials, to fabricate vertical 3D transistors. For example, certain materials, when combined with oxygen, may form new materials that exhibit semiconductor properties (e.g., can turn "off" with low off-state leakage current or can become highly conductive under certain circumstances). Some examples of N-type semiconductive oxides include In2O3, SnO2, InGaZnO, and ZnO. One example of a P-type semiconductive oxide is SnO. Additionally or alternatively, the channel may comprise a 2D material. Some example 2D materials for use in forming the channel include, but are not limited to, WS2, WSe2, WTe2, MoS2, MoSe2, MoTe2, HfS2, ZrS2, TiS2, GaSe, InSe, phosphorene, and other similar materials. The materials described herein to form the channel 202 may be deposited by an atomic layer deposition (ALD) process and may be 5-15 angstroms thick, the thinness lending to their name—2D material. Other deposition techniques may also be used, including but not limited to chemical vapor deposition (CVD), physical vapor deposition (PVD), and plasma-enhanced deposition techniques. The materials may be annealed during or after the device formation process to recrystallize or grow the crystals and thereby improve electrical characteristics.

After the channel 202 has been formed in block 328, the method 300 advances to block 334 of FIG. 3B. In block 334, the source contact 204 is formed. To do so, in the illustrative embodiment and similar to the drain contact 206, a silicide 1000 (e.g., a Tungsten or Titanium silicide) is deposited in the upper section 502 of the DRAM cell hole 500 on the channel 202 previously formed in the upper section 502 as shown in FIG. 10. Alternatively, the source contact 204 may be formed from silicon or other material having been properly doped to lower resistivity (e.g., via a Phosphorus, Arsenic, or other doping procedure).

Referring back to FIG. 3B, after the source contact 204 has been formed in block 334, the method 300 advances to block 338 in which the word line layer 402 and insulator layers 410, 412 are trimmed to define the transistor 104 as shown in FIG. 11. To do so, any suitable etching or other removal process may be used to trim the layers 402, 410, 412. Regardless, after the word line has been trimmed in block 338, the method 300 advances to block 340 in which the insulator layer 108 is formed over the transistor 104 as shown in FIG. 12. As discussed above, the insulator layer 108 may be formed from any suitable insulator material, such as a silicon oxide layer. Subsequently, in block 342 the bit line 110 is formed in the insulator layer 108 and in contact with the source contact 204 as shown in FIG. 13, and an additional layer 108 is subsequently formed over the bit line 110 to produce the vertical DRAM structures 102 shown in FIG. 13. To do so, any suitable etching and deposition process may be used to form the bit line 110. In the illustrative embodiment, the bit line 110 is formed from a tungsten material, but may be formed from other suitable conductive materials (e.g., Copper (Cu), Tungsten (W), Ruthenium (Ru), etc.) in other embodiments.

Referring back to FIG. 3B, after the bit line(s) 110 have been formed in block 342, the method 300 advances to block 344 in which a carrier substrate 1400 is attached to the insulator layer 108 as shown in FIG. 14. To do so, the carrier substrate 1400 may be bonded to the insulator layer 108 using any suitable bonding technique capable of attaching the carrier substrate 1400 to the insulator layer 108 (e.g., direct bonding such as an oxide-to-oxide bonding technique). In the illustrative embodiment, the carrier substrate 1400 is formed from silicon, but may be formed from other materials in other embodiments. Regardless, after the carrier substrate 1400 has been attached to the insulator layer 108, the method 300 advances to block 346 in which the substrate 404 (and, as such, the vertical DRAM structure 102) is flipped to facilitate access to a back side 1500 of the substrate 404, opposite the transistor 104, as shown in FIG. 15. In some embodiments, depending on the manufacturing machines and capabilities, the substrate 1404 may not require physical flipping as the manufacturing machines may be configured to directly access the back side 1500 of the substrate 404 during the performance of the method 300.

Regardless, after the back side 1500 of the substrate 404 has been accessed, the method 300 advances to block 348 in which the silicon substrate 404 is stripped from the pillar capacitor structure 706 (i.e., from the conductive core 220 and the insulator liner 600). To do so, any suitable stripping or etching process may be used to remove the substrate 404 and reveal the pillar capacitor structure 706 as shown in FIG. 17. For example, as shown in block 350, a reveal etch process may be used to remove the substrate 400 and reveal the insulator liner 600.

Subsequently, after the insulator liner 600 has been exposed in block 348, the method 300 advances to block 352 in which the dielectric layer 222 is formed on the conductive core 220 of the pillar capacitor structure 706. The dielectric layer 222 may be formed from any suitable insulator material. For example, in the illustrative embodiment in block 354, a Zirconia-Alumina-Zirconia (ZAZ) layer 1800 is formed on the conductive core 220 as shown in FIG. 18. To do so, any suitable deposition, growth, or other formation technique may be used, such as a chemical vapor deposition (CVD) or plasma-enhanced chemical vapor deposition technique.

Referring back to FIG. 3B, after the dielectric layer 222 has been formed on the conductive core 220 of the pillar capacitor structure 706, the method 300 advances to block 356. In block 356, the electrode 224 of the pillar capacitor 106 is formed on the dielectric layer 222. The electrode 224 may be formed from any suitable conductive material. For example, in the illustrative embodiment in block 358, a Titanium Silicon Nitride (TiSiN) layer 1900 is deposited on the dielectric layer 222 as shown in FIG. 19. Again, any suitable deposition, growth, or other formation technique may be used, such as a chemical vapor deposition (CVD) or plasma-enhanced chemical vapor deposition technique, to form the electrode 1900, 224. Regardless, after the electrode 224 has been formed on the dielectric layer 222 in block 356, the method 300 advances to block 360 in which another insulator layer 108 is formed on the pillar capacitor 106 as shown in FIG. 20. Again, as discussed above, the insulator layer 108 may be formed from any suitable insulator material, such as a silicon oxide layer.

Again, it should be appreciated that because the conductive core 220 of the pillar capacitor 106 is formed in the lower section 504 of the common DRAM cell hole 500 and the channel 202 of the transistor 104 is formed in the upper section 502 of the DRAM cell hole 500, the conductive core 220 and the channel 202 are vertically aligned with each other. Furthermore, because the pillar capacitor structure 106 is formed prior to the formation of the transistor 104, the likelihood of misalignment between the pillar capacitor 106 and the transistor 104 is reduced.

While the disclosure has been illustrated and described in detail in the drawings and foregoing description, such an illustration and description is to be considered as illustrative and not restrictive in character, it being understood that only illustrative embodiments have been shown and described and that all changes and modifications that come within the spirit of the disclosure are desired to be protected.

There are a plurality of advantages of the present disclosure arising from the various features of the methods, apparatuses, and systems described herein. It will be noted that alternative embodiments of the methods, apparatuses, and/or systems of the present disclosure may not include all of the features described yet still benefit from at least some of the advantages of such features. Those of ordinary skill in the art may readily devise their own implementations of the methods, apparatuses, and systems that incorporate one or more of the features of the present invention and fall within the spirit and scope of the present disclosure as defined by the appended claims.

The invention claimed is:

1. A method for forming a vertical dynamic random access memory (DRAM) structure, the method comprising:
    forming a word line layer on a first side of a substrate;
    forming a DRAM cell hole through the word line layer and the substrate, wherein the DRAM cell hole includes a first section that extends through the word line layer and a second section that extends through the substrate;
    after forming the DRAM cell hole through the word line layer and the substrate, filling at least a portion of the second section of the DRAM cell hole with a conductive material;
    forming a pillar capacitor structure using the conductive material in the second section of the DRAM cell hole as a conductive core of the pillar capacitor structure; and
    forming a transistor by providing a source contact, a drain contact, and a transistor channel in the first section of the DRAM cell hole.

2. The method of claim 1, wherein forming the transistor channel comprises depositing a semiconductor material into the first section of the DRAM cell hole.

3. The method of claim 1, further comprising:
    flipping the substrate, subsequent to forming the transistor, to expose a second side of the substrate opposite the first side, and
    removing the substrate to reveal the pillar capacitor structure.

4. The method of claim 1, wherein forming the pillar capacitor structure comprises providing polysilicon in the second section of the DRAM cell hole to form a polysilicon conductive core, and further comprising:
    flipping the substrate, subsequent to forming the transistor, to expose a second side of the substrate opposite the first side, and
    removing the substrate to reveal the polysilicon conductive core.

5. The method of claim 4, further comprising:
    forming, subsequent to the removing of the substrate, a capacitor dielectric layer on the polysilicon conductive core; and
    forming a capacitor electrode on the dielectric layer.

6. The method of claim 5, wherein forming the dielectric layer comprises forming a Zirconia-Alumina-Zirconia ($ZrO_3/Al_2O_3/ZrO_2$) layer on the polysilicon conductive core, and wherein forming the electrode comprises forming a Titanium Silicon Nitride (TiSiN) electrode on the $ZrO_3/Al_2O_3/ZrO_2$ layer.

7. The method of claim 1, wherein forming the word line layer comprises depositing a first insulator layer on the first side of the substrate, depositing a metallization layer on the first insulator layer, and forming a second insulating later on the metallization layer.

8. The method of claim 1, further comprising forming an insulator liner in the DRAM cell hole,
    wherein filling at least a portion of the second section of the DRAM cell hole with the conductive material comprises forming the conductive material on the insulator liner and in the second section of the DRAM cell hole.

9. The method of claim 8, wherein forming the transistor using the first section of the DRAM cell hole as the channel of the transistor comprises forming a transistor using a portion of the insulator liner located in the first section of the DRAM cell hole as a gate oxide of the transistor.

10. The method of claim 9, wherein forming the transistor comprises:
    forming a drain contact in the first section of the DRAM cell hole and on a proximal surface of the polysilicon conductive core;
    depositing indium gallium zinc oxide (IGZO) on the drain contact and in the first section of the DRAM cell hole to form the transistor channel of the transistor; and
    forming a source contact on the transistor channel of the transistor and in the first section of the DRAM cell hole.

11. The method of claim 10, wherein forming the transistor comprises:
    trimming the word line layer to define a width of the transistor;
    depositing an insulator layer over the transistor; and
    forming a bit line in the insulator layer and in contact with the source contact.

12. The method of claim 11, further comprising:
    flipping the substrate, subsequent to forming the transistor, to expose a second side of the substrate opposite the first side, and
    removing the substrate to reveal the polysilicon conductive core.

13. The method of claim 12, further comprising:
    forming, subsequent to the removing of the substrate, a dielectric layer on the polysilicon conductive core; and
    forming an electrode on the dielectric layer.

* * * * *